US012663459B2

(12) United States Patent
Ahmed et al.

(10) Patent No.: US 12,663,459 B2
(45) Date of Patent: Jun. 23, 2026

(54) TEST SIGNAL CIRCUIT FOR TESTING A RADIO FREQUENCY RECEIVER CIRCUIT, A SEMICONDUCTOR CHIP AND A SYSTEM COMPRISING THE TEST SIGNAL CIRCUIT

(71) Applicant: Infineon Technologies AG, Neubiberg (DE)

(72) Inventors: Faisal Ahmed, Engerwitzdorf (AT); Muhammad Furqan, Linz (AT); Stefan Herzinger, Sauerlach (DE); Thomas Obermueller, Linz (AT)

(73) Assignee: Infineon Technologies AG, Neubiberg (DE)

( * ) Notice: Subject to any disclaimer, the term of this patent is extended or adjusted under 35 U.S.C. 154(b) by 204 days.

(21) Appl. No.: 18/743,626

(22) Filed: Jun. 14, 2024

(65) Prior Publication Data

US 2024/0426898 A1     Dec. 26, 2024

(30) Foreign Application Priority Data

Jun. 20, 2023    (DE) .......................... 102023205733.6

(51) Int. Cl.
*G01R 31/28*        (2006.01)
(52) U.S. Cl.
CPC ................................ *G01R 31/2856* (2013.01)
(58) Field of Classification Search
CPC ........................ G01R 31/2856; G01R 31/2822
See application file for complete search history.

(56) References Cited

U.S. PATENT DOCUMENTS

| | | | |
|---|---|---|---|
| 7,640,468 B2 * | 12/2009 | Linam ............ | G01R 31/318572 |
| | | | 714/724 |
| 2016/0087734 A1 * | 3/2016 | Kordik ............... | H04B 17/0085 |
| | | | 455/67.14 |
| 2021/0190910 A1 | 6/2021 | Itkin | |
| 2025/0271495 A1 * | 8/2025 | Lai ..................... | G01R 31/2884 |

FOREIGN PATENT DOCUMENTS

| | | |
|---|---|---|
| DE | 102017127416 A1 | 6/2018 |
| DE | 102017129330 B3 | 1/2019 |

* cited by examiner

*Primary Examiner* — Giovanni Astacio-Oquendo
(74) *Attorney, Agent, or Firm* — Harrity & Harrity, LLP

(57)            ABSTRACT

Test signal circuit for testing a radio frequency receiver circuit, including: a test signal generator configured to generate a baseband test signal, a modulator configured to modulate a local oscillator signal with the baseband test signal to generate a test signal, a first transmission element coupled between the modulator and an input of an impedance transforming element, a second transmission element coupled to an output of the impedance transforming element, the impedance transforming element configured to lower a first impedance level of the first transmission element to a second impedance level of a second transmission element, a voltage level detector coupled to the first transmission element, the voltage level detector being configured to detect a voltage level of the test signal. The disclosure further relates to a semiconductor chip including the test signal circuit and a system including the test signal circuit and a control circuit.

20 Claims, 4 Drawing Sheets

TEST SIGNAL CIRCUIT FOR TESTING A RADIO FREQUENCY RECEIVER CIRCUIT, A SEMICONDUCTOR CHIP AND A SYSTEM COMPRISING THE TEST SIGNAL CIRCUIT

CROSS-REFERENCE TO RELATED APPLICATION

This application claims priority to German Patent Application No. 102023205733.6 filed on Jun. 20, 2023, the content of which is incorporated by reference herein in its entirety.

TECHNICAL FIELD

The present disclosure relates to a test signal circuit, a semiconductor chip and a system comprising the test signal circuit.

BACKGROUND

Radar systems (radar: Radio Detection and Ranging) comprise a transmitter and a receiver. The transmitter sends out radio waves that hit an object and are reflected. The reflected radio waves are received by the receiver. This allows to determine the object's distance, velocity and/or direction in relation to the radar system. Radar systems operate in the microwave GHz range and have a broad spectrum of applications, including air traffic, weather, marine, etc.

Radar systems are increasingly being used in the automotive sector for e.g., autonomous driving, and/or other advanced driver assistance systems like adaptive cruise control, lane change assist, blind spot detection and the like. Automotive radars may be used to detect the speed, range and/or direction of objects in the vicinity of the car. Automotive radars may for example use a frequency band around 24 GHz for short-range radar or a frequency band around 77 GHz, e.g., from 76 GHz to 81 GHz, for long-range radar.

A radio transceiver is an electronic device, which is a combination of a radio transmitter and a radio receiver. Its radio frequency (RF) circuits may sometimes be referred to as RF frontend. Radar transceivers can for example be realized on a single chip with highly integrated RF circuits, combining functions of the RF frontend in a single housing. An example of such a highly integrated design is a monolithic microwave integrated circuit (MMIC), where functions of the radar transceiver, including the RF circuits of the transceiver, may be realized. Radar transceivers may comprise test signal circuits which generate test signals which are fed to the radio receiver to test characteristics of the receiver, e. g. a gain of the receiver.

SUMMARY

According to one aspect of the disclosure, a test signal circuit for testing a radio frequency receiver circuit includes: a test signal generator configured to generate a baseband test signal, a modulator configured to modulate a local oscillator signal with the baseband test signal to generate a test signal, a first transmission element coupled between the modulator and an input of an impedance transforming element, a second transmission element coupled to an output of the impedance transforming element, the impedance transforming element configured to lower a first impedance level of the first transmission element to a second impedance level of the second transmission element, at least one voltage level detector coupled to the first transmission element, the at least one voltage level detector being configured to detect a voltage level of the test signal.

According to another aspect of the disclosure a semiconductor chip includes the test signal circuit and the radio frequency receiver circuit.

According to another aspect of the disclosure a system includes a test signal circuit and a control circuit, wherein the control circuit includes: a first interface being coupled to the radio frequency receiver circuit for receiving a signal indicative of the test signal being processed by the radio frequency receiver circuit, a processor being configured to generate a control signal depending on the signal, a second interface being coupled to the test signal generator for transmitting the control signal to the test signal generator.

The test signal circuit, the semiconductor chip and the system including the test signal circuit allow for a highly efficient test signal circuit in terms of area on the semiconductor chip. Furthermore, power savings may be realized.

A voltage level of the test signal may be used to monitor the characteristics of the receiver circuit, to which the test signal may be applied. According to an aspect of the implementation, a voltage level detector is used to detect a voltage level of the generated test signal. From the voltage level of the test signal, the power level of the test signal may be deduced. The voltage level detector can be capacitively coupled to a high impedance node which results in a high voltage swing, enabling the utilization of a sensitive region of the transfer function of a voltage level detector. The test signal circuit according to this application offers a very economic use of semiconductor chip area.

The first and the second transmission element may be a transmission line, e. g. a transmission strip on the semiconductor chip.

Compared to conventional power level detectors which couple a portion of the power from the main signal line using low impedance lines (such as a 50 Ohm directional coupler), a voltage level detector that is capacitively coupled to an RF node with high impedance magnitude generates a higher output sense voltage and subsequently enables sensitive power detection even at power levels that are significantly too low for a 50-Ohm based power level detection.

A test signal circuit according to this application is used to generate a test signal which is fed to the radio frequency receiver circuit in order to check one or more characteristics, also called parameters, of this radio frequency receiver circuit. Therefore, it is important to know the test signal which is fed into the radio frequency receiver circuit. The test signal may then later be compared to the signal generated by the radio frequency receiver circuit in response to the test signal. The test signal seen by the radio frequency receiver circuit is like a received signal. By comparing the test signal with the signal output by the receiver circuit, it is possible to determine, for example, parameters like the gain of this radio frequency receiver circuit.

The test signal circuit is usually implemented on a semiconductor chip, but it is also possible to use distinct semiconductor chips being connected or discrete electric circuit elements for realizing the test signal circuit. It is possible that at least a part of the functionality of the test signal circuit is realized as a software program.

The test signal circuit generates the testing signal at frequencies, which are used for receiving radio signals. The radio frequency receiver circuit could also be implemented on a semiconductor chip. It could be the same semiconductor chip as for implementing the test signal circuit. The radio frequency receiver circuit is for example configured to receive radar signals.

The test signal circuit exhibits a test signal generator configured to generate a baseband test signal. This test signal generator is for example fed with a clock signal and takes the baseband test signal out of a memory in order to form the test signal. The baseband test signal could also be supplied by another component for example by any other component that is connected to the test signal generator. The test signal is generated using a modulator configured to modulate a local oscillator signal with the baseband test signal to generate the test signal. The local oscillator is usually not part of the test signal circuit but a separate element. The local oscillator signal is used to generate the test signal using the baseband test signal. This means the modulator transforms the baseband test signal to a high frequency region. Between this modulator and an input of an impedance transforming element a first transmission element is provided. This first transmission element could be a transmission line or any other electrical network which is matched to the impedance of the impedance transforming element.

A second transmission element is coupled to an output of the impedance transforming element. The second transmission element could also be a transmission line or any other resistor network. The second transmission element is configured to match the input resistance of the receiver circuit, which may for example be 50 Ohm.

The impedance transforming element is configured to transform the impedance of the first transmission line to the impedance of the second transmission line in order to match the impedance on either side.

At least one voltage level detector, which is coupled to this first transmission element is configured to detect a voltage level of the test signal. For this voltage level detector conventional technologies could be implemented to measure the voltage level of the test signal. The voltage level detector is capacitively coupled to the first transmission element such that only a voltage swing is sensed, and no power transfer is required. An impedance transformation is not needed in this case.

The semiconductor chip could consist of any other appropriate semiconductor like silicon, silicon carbide or gallium nitride or of any other compound semiconductor.

In an implementation, the test signal circuit includes a first and a second voltage level detector. The modulator is configured as a quadrature amplitude modulator, which generates the test signal as two components: a first component on an I path and a second component on a Q path. The first voltage level detector is connected to the I path, and the second voltage level detector is connected to the Q path. The outputs of I VLD and Q VLD can be combined in an analog way (by connecting the two outputs together) or after an ADC. Both implementations provide a suppression of amplitude modulation (AM) ripples at approximately the same level.

The impedance transforming element includes a power combiner, which combines the first and second components. The quadrature amplitude modulator conveys two analog message signals or two digital bit streams using amplitude shift keying (ASK) or amplitude modulation (AM) schemes. This is achieved by modulating the amplitudes of two carrier waves, which have the same frequency and are out of phase with each other by 90° (a condition known as orthogonality or quadrature).

A power combiner is a passive device used in the field of radio frequency circuit design. The power combiner combines the power of the I path and the Q path.

Furthermore, it is proposed that a third voltage level detector is coupled to the second transmission element between the impedance transforming element and the radio frequency receiver circuit. Using this additional voltage level detector, it is possible to detect ripples in the time domain signals. It is possible to detect the sources of imbalances. This information can be used to optimize the phase of the digital modulating signal, so that the residual peak to mean signal swing is reduced below a predefined limit. In particular, the detected third voltage level may be evaluated together with the combined voltage levels as detected by the first and second voltage detectors on the I and Q path. With this information, the quality of the I/Q-signal generation may be further improved. In particular, the imbalance may be reduced.

Moreover, it is proposed that the at least one voltage level detector is coupled to the first transmission element between the impedance transforming element and a power combiner. This arrangement results in a high impedance seen by the voltage level detector which is higher than the impedance of 50 Ohm used in conventional power level detection systems.

It is proposed that the impedance of the first transmission element is more than two times higher than the impedance of the second transmission element. For example, with an impedance of 50 Ohm for the second transmission element, the impedance of the first transmission element may be more than 100 Ohm, preferably even 200 Ohm.

In an implementation at least one voltage level detector is coupled to the first transmission element closer to the modulator than to the impedance transforming element, because the modulator exhibits a high impedance at its output, which can advantageously be used by the voltage level detector. In implementations, the at least one voltage level detector may be coupled to the first transmission element at a location which is close to the highest impedance point of the first transmission element.

Moreover, it is proposed that the test signal generator includes a digital test signal data generator and a digital-to-analog converter to generate the baseband test signal. This is an efficient and simple way of generating the baseband test signal.

Furthermore, it is proposed that the test signal circuit is configured for testing at least one of the following characteristics of the radio frequency receiver circuit. The gain, frequency response, inter-channel amplitude and phase balance, and/or inter-channel noise of the radio frequency receiver circuit. With these parameters, it is possible to check the radio frequency receiver circuit thoroughly.

It is further proposed that an analog-to-digital converter is coupled to an output of the at least one voltage level detector, wherein the analog-to-digital converter is configured to convert a voltage level to a digital signal and to output the digital signal to a control circuit connected to the test signal circuit. The control signal is used to optimize the test signal circuit in operation, for example to optimize the generation of the test signal.

The control circuit includes at least two interfaces for being connected to the test signal generator and for transmitting the control signal to the test signal generator but also for receiving the signal indicative of the test signal that is being processed by the radio frequency receiver circuit. The processor for example a microcontroller or a microprocessor or digital signal processor is configured to generate a control signal depending on the received signal.

It is further proposed that the control circuit includes a third interface being coupled to an output of the analog-to-digital converter for receiving the digital signal and wherein the processor is configured to generate the control signal depending on the digital signal and the signal.

It is further proposed that an output of the third voltage level detector is coupled to the analog-to-digital converter.

Moreover, it is proposed that the processor is configured to receive the digital signal and to generate the control signal such that imperfections of the modulator such as an IQ imbalance are reduced. This improves the signal quality of the test signal.

BRIEF DESCRIPTION OF THE DRAWINGS

Implementations will now be described with reference to the attached drawing figures by way of example only. Like reference numerals are used to refer to like elements throughout.

The illustrated structures and devices are not necessarily drawn to scale.

DETAILED DESCRIPTION

Figure 1:
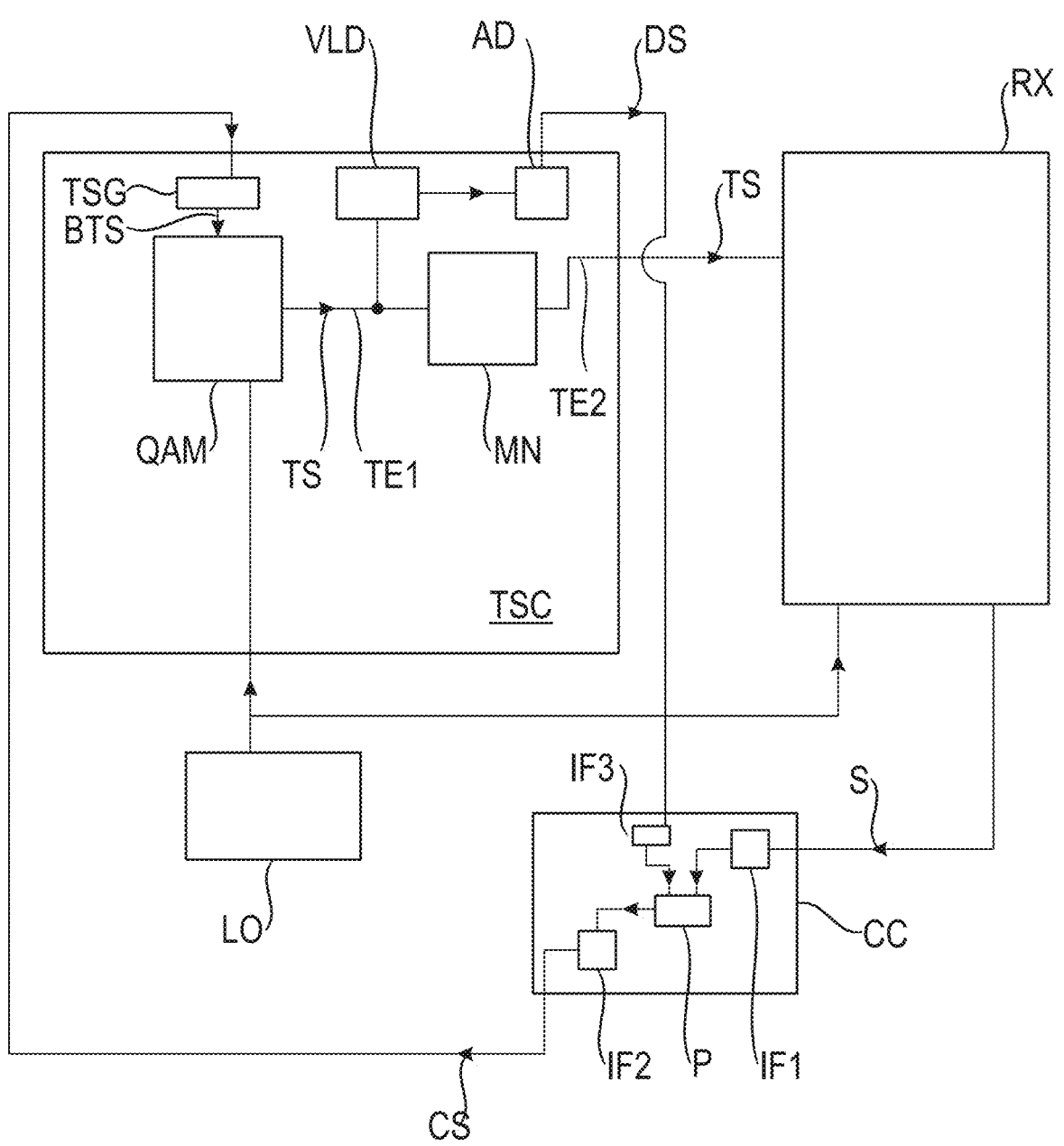
FIG. 1 illustrates a block diagram of a system comprising a test signal circuit.

FIG. 1 illustrates a block diagram of a system comprising a test signal circuit TSC, a radio frequency receiver circuit RX and a control circuit CC. A local oscillator LO provides a local oscillator signal to the test signal circuit TSC and to the radio frequency receiver circuit RX.

In the test signal circuit TSC, the signal provided by the local oscillator LO is received by the modulator QAM using for example, quadrature amplitude modulation. This modulator QAM combines the signal of the local oscillator LO with the baseband test signal BTS provided by the test signal generator TSG to form the test signal TS. This is often referred to as a modulation of the local oscillator signal with the baseband test signal BTS.

The test signal TS is provided to an impedance transforming element MN via the first transmission element TE1, the first transmission element TE1 being coupled in between the modulator QAM and the impedance transforming element MN. The impedance transforming element MN may for example be an impedance matching network. In addition, a voltage level detector VLD is connected to the first transmission element TE1 to measure the voltage level of the test signal TS. The impedance transforming element MN is connected to a second transmission element TE2 transmitting the test signal TS to the radio frequency receiver circuit RX.

The test signal is tapped by the voltage level detector VLD at the first transmission element TE1 as the first transmission element TE1 exhibits a higher impedance level than the second transmission element TE2. The second transmission element TE2 may be limited in many applications to standard characteristic impedances such as 50 Ohm or 70 Ohm. A higher impedance level at the first transmission element TE1 results in a correspondingly higher voltage sensed by the voltage level detector VLD.

The voltage level detector VLD may comprise an electrical circuit comprising diodes, resistors and/or transistors. It may further comprise a current path and associated mirror current path for detecting the voltage level.

The voltage level detector VLD transmits the voltage level to an analog-to-digital converter AD generating a digital signal DS using the detected voltage level. The analog-to-digital converter AD may for example be an analog-to-digital converter AD which is specifically configured for sensing different voltages. It offers a high resolution and a lower leakage, which is specifically suitable for small signals. The digital signal DS is communicated to a control circuit CC. The control circuit CC receives the digital signal DS via its interface IF3, which is connected to a processor P.

The impedance of the second transmission element TE2 is chosen to match the input impedance of the receiver circuit RX, which can for example be 50 Ohm. The impedance of the first transmission element TE1 is therefore chosen to be higher than the impedance of the second transmission element TE2. Coupling the voltage level detector VLD to the high-impedance first transmission element TE1 and outputting the test signal TS to the radio receiver RX over the low-impedance second transmission element TE2 has the advantage that the voltage level detector VLD can be operated with a high input impedance and at the same time, the input impedance of the receiver circuit RX can be matched to a lower impedance.

The radio frequency receiver circuit RX processes the test signal TS as it would process signals received over an antenna. Accordingly, the test signal TS is amplified, demodulated, and transformed into a signal S by the receiver circuit RX. The signal S is a digital signal and might be used for example to calculate a gain of the receiver circuit RX.

Figure 2:
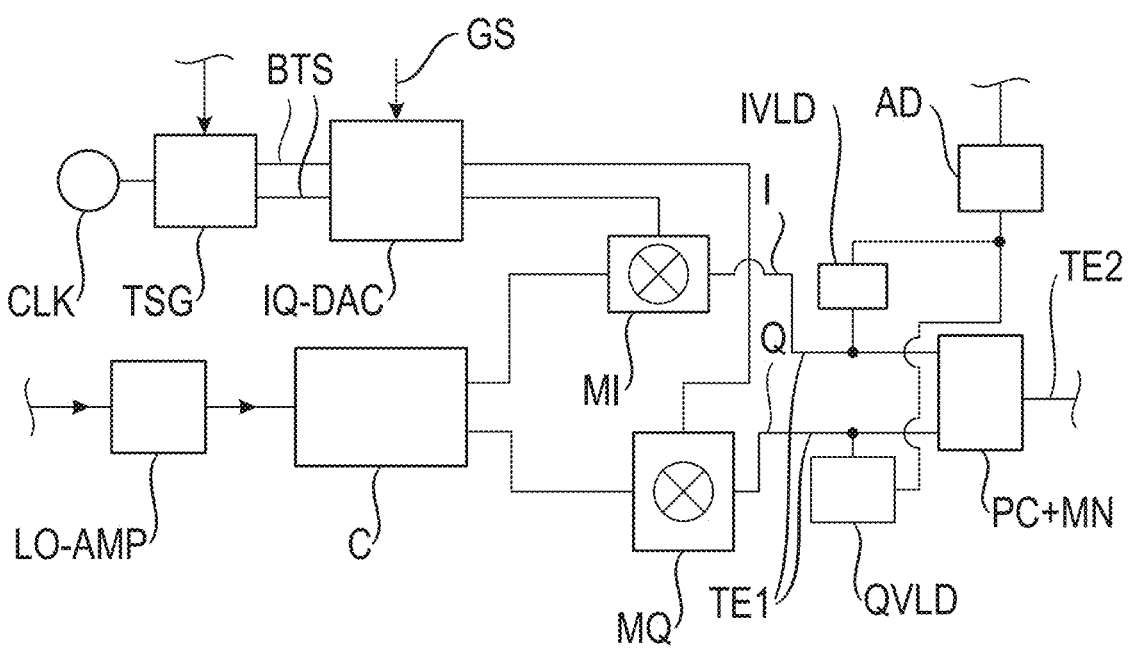
FIG. 2 illustrates a block diagram of the test signal circuit comprising two voltage level detectors.

FIG. 2 illustrates in further detail the elements of an implementation of the test signal circuit TSC. The signal from the local oscillator LO is received by an amplifier LO-AMP amplifying the signal provided by the local oscillator LO. This amplified signal is fed into a coupler C providing signals to two mixers MI and MQ, mixing the signal provided by the coupler C with the baseband test signal BTS for the I path and the Q path. The mixer MI acts as modulator for the I-path. The mixer MQ acts as modulator for the Q-path. The coupler C operates as a 90 degree hybrid coupler allocating a part of the power to the two mixers respectively.

The test signal generator TSG generates the baseband test signal BTS using a clock signal CLK and the control signal CS and provides the baseband test signal BTS as two components for the quadrature amplitude modulation. One component is the I component and the other the Q component. Both components are fed to a digital-to-analog converter IQ-DAC, providing the respective components as analog signals to the mixers MI, MQ. The digital-to-analog converter IQ-DAC comprises a gain select GS input. Using the gain select GS it is possible to influence the respective amplitudes of the signals provided to the mixers MI, MQ. The two components of the baseband test signal BTS are then provided to the mixers MI, MQ. The so modulated signals of the I and the Q components are provided on the I path and a Q path respectively. They are then fed over a first transmission element to a combination of a power combiner and of the impedance transforming element PC+MN.

The mixers MI, MQ have a high complex impedance at their output. The first transmission element TE1 coupled to their output is tapped by the respective voltage level detectors IVLD, QVLD. The respective voltage detectors IVLD, QVLD are preferably coupled to the first transmission element TE1 close to the output of the respective mixer MI, MQ in order to benefit from the high output impedance of the mixers MI, MQ. The impedance of the first transmission element TE1 may typically drop with increasing distance from the mixers MI, MQ.

The voltage level detectors IVLD, QVLD may both be connected to the analog-to-digital converter AD transforming the detected voltage levels into the digital signal DS. In the implementation shown in FIG. 2, the two analog output signals of the first and second voltage level detector IVLD, QVLD are combined in the analog domain by connecting the output lines of the two voltage level detectors IVLD, QVLD. The combined analog signal is then input to the analog-to-digital converter AD. The analog-to-digital converter AD generates the digital signal DS and provides it to the control circuit CC.

The second transmission element TE2 is coupled to the other side of the power combiner and impedance transforming element PC+MN. The second transmission element TE2 connects the test signal circuit TSC to the radio frequency receiver circuit RX. The impedance of the second transmission element TE2 is for example 50 Ohm, which is a commonly used impedance of a radio frequency receiver circuit RX input.

The power combiner PC of the power combiner and impedance transforming element PC+MN can therefore be configured to combine power of the I path and the Q path. The power combiner PC may combine the I and Q path by connecting the lines to provide an analog combination.

The impedance matching element MN of the power combiner and impedance transforming element PC+MN can be configured to match the impedance of the second transmission element TE2 to the input of the receiver circuit RX.

The impedance of the first transmission element TE1 is chosen to be higher than the impedance of the second transmission element TE2. This allows a tapping of the test signal TS by the voltage level detector VLD at a node of higher impedance, resulting in higher sensed voltage and at the same time, the input impedance after the transformation is matched to the typically lower characteristic impedance of the receiver circuit, such as 50 Ohm.

Figure 3:
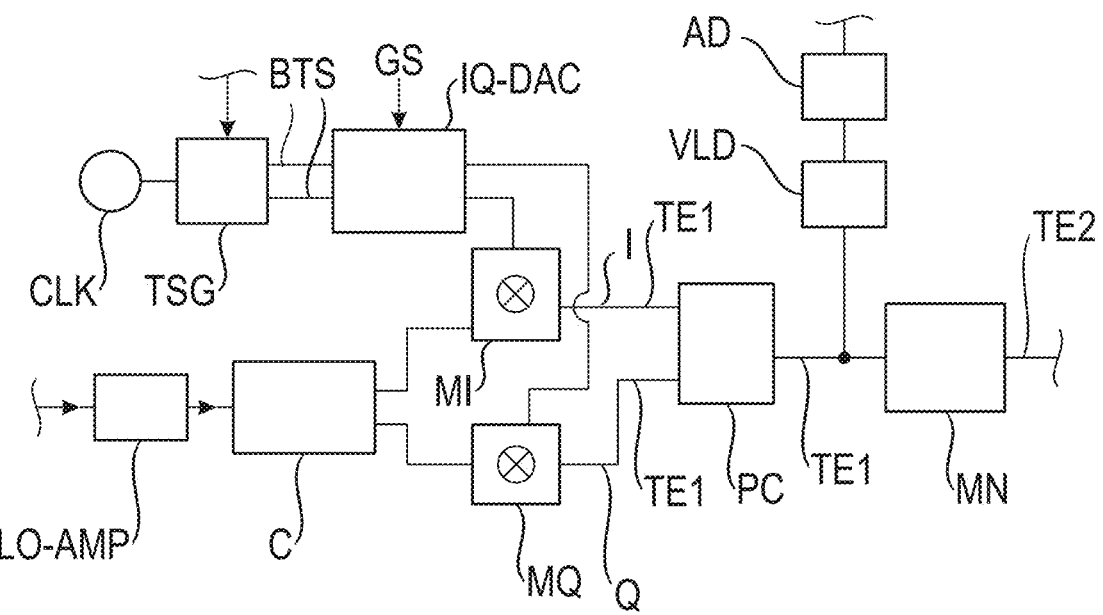
FIG. 3 illustrates a block diagram of the test signal circuit comprising one voltage level detector.

FIG. 3 illustrates a block diagram of another implementation of a test signal circuit TSC. The first transmission element TE1 is coupled to the mixers MI, MQ and to the power combiner PC, which combines the power on the I and Q path.

A further part of the first transmission element TE1 is further coupled between the power combiner PC the impedance transforming element MN. This impedance transforming element MN is connected on the other side to the second transmission element TE2. A single voltage level detector VLD is connected to the first transmission element TE1 between the power combiner PC and the impedance transforming element MN. The impedance transforming element MN may be a matching network matching the impedance of the first transmission element TE1 to the impedance of the second transmission element TE2.

In this implementation, the voltage level detector VLD detects the voltage level of the combined I/Q path. Distinguished from the implementation of FIG. 2, only one voltage level detector VLD is needed. However, the power combiner PC has an additional loss before the signal is sensed by the voltage level VLD. Furthermore, after power combining, one sideband is suppressed resulting in a lower peak voltage.

The voltage level detected by the voltage level detector VLD is then transmitted to the analog-to-digital converter AD which creates the digital signal DS as explained above.

The impedance of the first transmission element TE1 is chosen to be higher than the impedance of the second transmission element TE2. This allows for the voltage level detector VLD to be operated with a high input impedance and at the same time, the input impedance of the receiver circuit RX can be matched to a lower impedance. In this implementation, a typical value of the absolute impedance value of the first transmission element TE1 may be 75 Ohm. A typical value of the absolute impedance value of the second transmission element TE2 is 50 Ohm. This implementation still works well with the impedance of the first transmission element TE1 being around 50% higher than the impedance of the second transmission element TE2.

Figure 4:
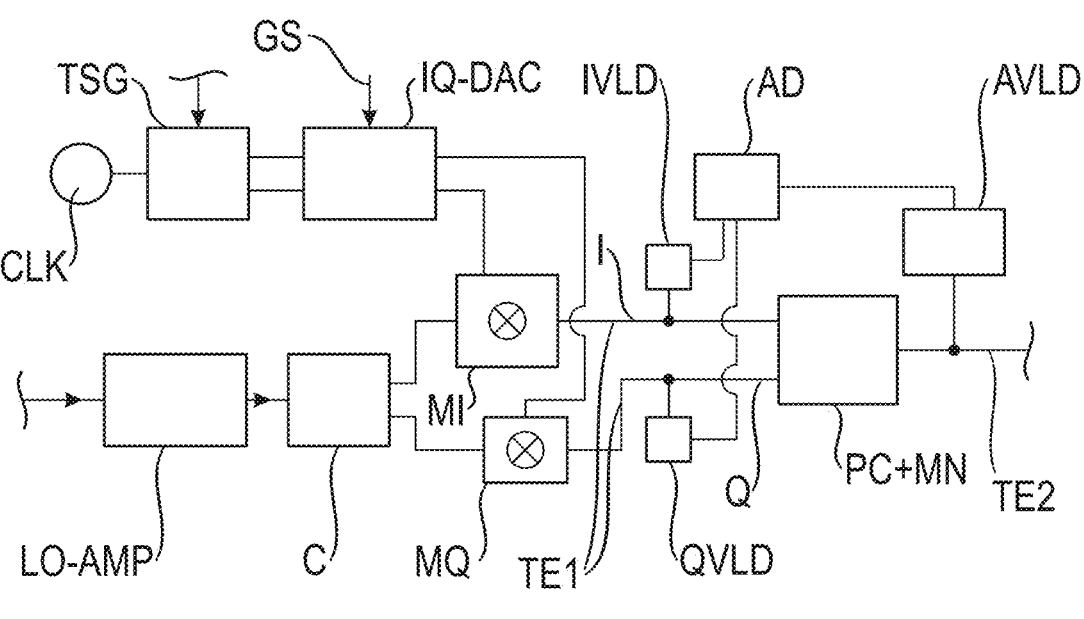
FIG. 4 illustrates a fourth block diagram of the test signal circuit comprising three voltage level detectors.

FIG. 4 illustrates a block diagram of another implementation of a test signal circuit TSC. The power combiner PC and the impedance transforming element MN are again combined in one element PC+MN. Separate voltage detectors IVLD and QVLD are connected respectively to the I path and to the Q path. Both voltage level detectors IVLD and QVLD are connected to the analog-to-digital converter AD.

The voltage level detectors IVLD, QVLD are both connected to the analog-to-digital converter AD transforming the detected voltage levels into the digital signal DS. In the implementation shown in FIG. 4, the two analog output signals of the first and second voltage level detector IVLD, QVLD are input separately to the analog-to-digital converter AD. The analog-to-digital converter AD converts them to the digital domain and combines them in the digital domain.

A third voltage level detector AVLD is connected to the second transmission element TE2. This third voltage level detected by the third voltage level detector AVLD is transmitted also to the analog-to-digital converter AD. It is converted to the digital domain within the analog-to-digital converter AD.

Using the analog signals received from the voltage level detectors IVLD, QVLD, AVLD, the analog-to-digital converter AD generates the digital signal DS and provides it to the control circuit CC.

Figure 5:
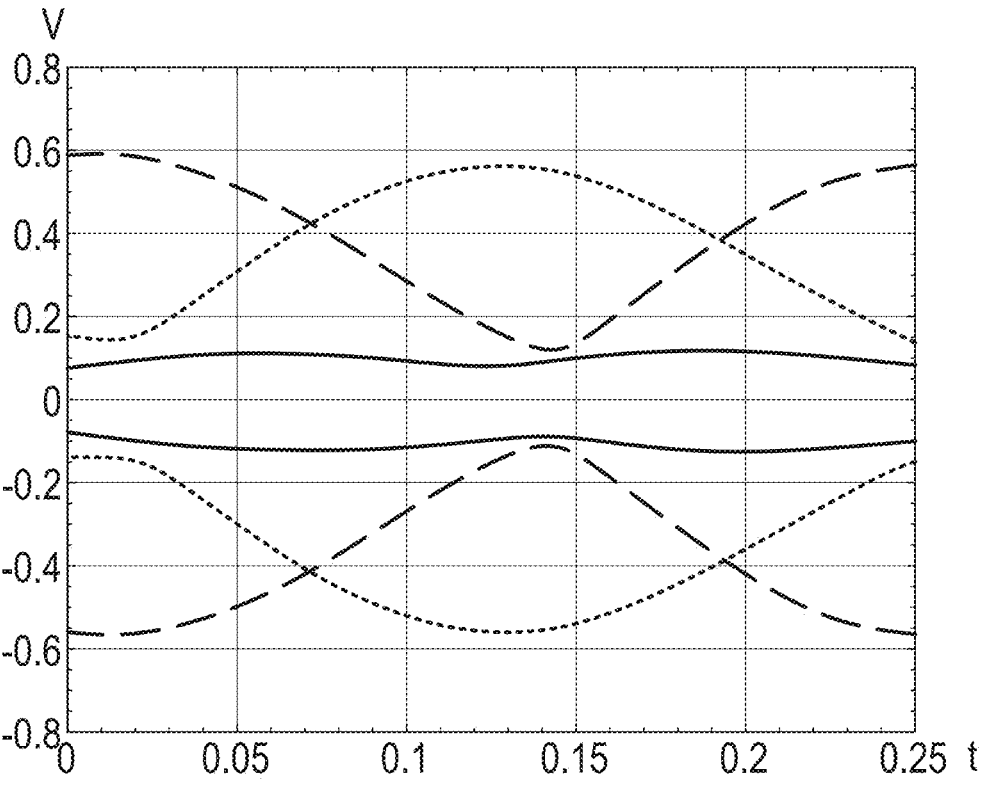
FIG. 5 illustrates a voltage-time diagram.

FIG. 5 illustrates in a voltage-time diagram with the dotted lines being an envelope of the input to the power combiner PC of FIG. 4 on the Q path. The graph shows the output voltage in volts over time in microseconds. The dashed lines are the envelope of the input to the power combiner PC of FIG. 4 on the I path. The combined output of the power combiner PC is shown in solid lines. It is shown to be quite stable, with slow oscillations with low amplitude, as compared to the I and Q input which are oscillating with higher amplitude.

The combined signal in solid lines nonetheless shows small variations in its amplitude which may be called ripple. The ripple is due to certain imbalances in the I/Q signal generation.

Figure 6:
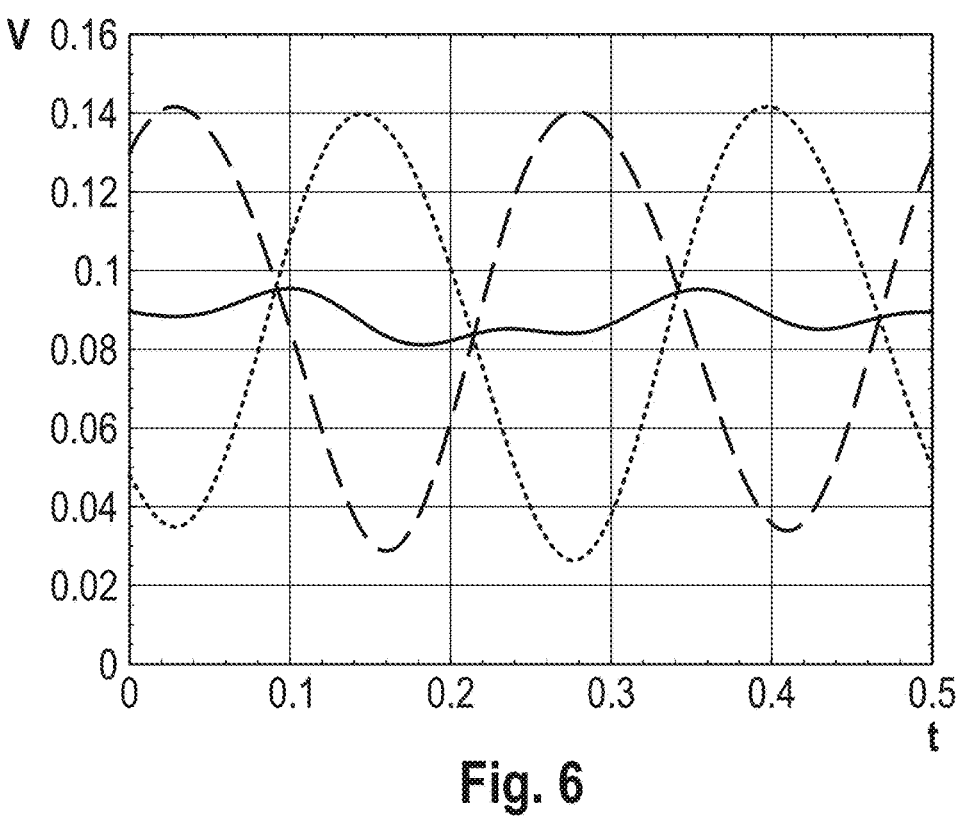
FIG. 6 illustrates a voltage-time diagram.

FIG. 6 shows a graph displaying the I output signal of the first voltage level detector IVLD in dashed lines and the Q output signal of the second voltage level detector QVLD in dotted lines. The graph shows the output voltage in volts over time in microseconds. These I and Q output signals both show significant ripples. Also shown is a combined signal of the I output signal and the Q output signal in a solid line. These ripples can be suppressed significantly by combining the two outputs I and Q of the first and second voltage level detector IVLD, QVLD. By using this combination, e. g. by the analog-to-digital converter AD as described above, it is possible to suppress the ripples significantly.

The so-called ripple constitutes an error of the voltage level detection. A lower ripple is more desirable because the voltage level detection is then more accurate. The ripple may be addressed by low pass filtering the combined output signal of the voltage level detector VLD. Such a low-pass filter does not need to be very good quality, nor does it need to have a very low cut-off frequency. Nonetheless, the circuit may produce a faster response if no low-pass filtering is applied, because the filtering uses time.

There may be implementations where no low-pass filter is needed and where the accuracy of the combined output signal of the voltage level detector VLD is good enough even without low-pass filtering. The choice depends on the overall accuracy needed.

The implementation of FIG. 4 allows for addressing the ripple in the combined signal by using the third voltage level as detected by the third voltage level detector AVLD. In connection with the combined signal of the first and second voltage level detector IVLD, QVLD it may be used to gain information about the imbalance of the test signal TS and to influence the generation of the I/Q signal generation with the aim of generating a more balanced I/Q signal.

Figure 7:
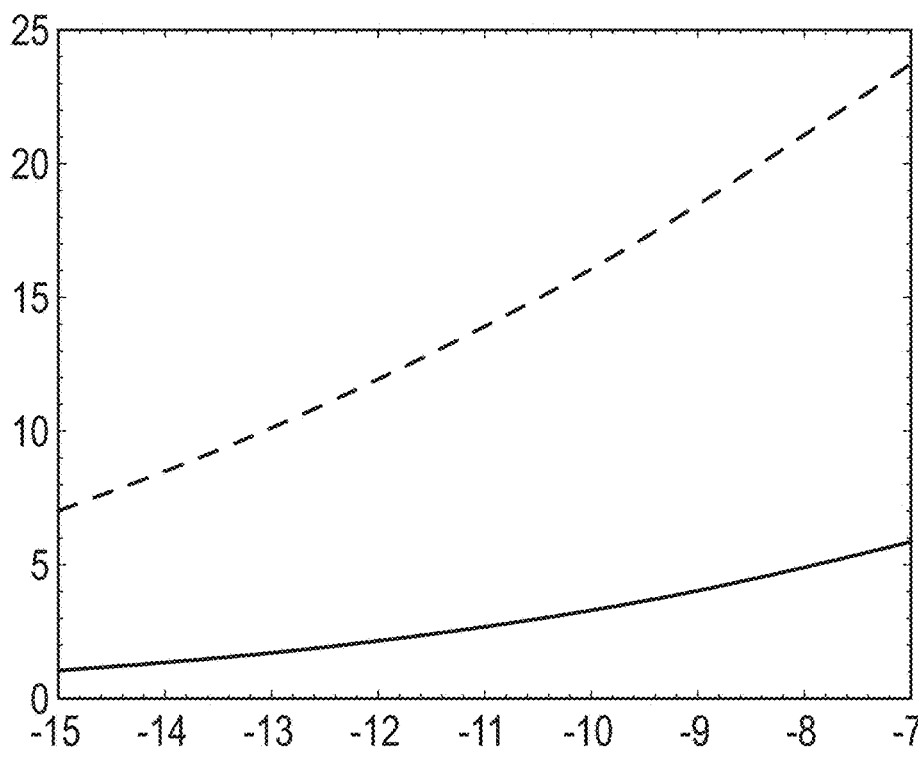
FIG. 7 illustrates a sensitivity-output power diagram.

FIG. 7 illustrates in a sensitivity-output power diagram a comparison of the proposal of this application shown by the dashed curve as compared to the solid curve which results if one uses for example a power level detector instead of a voltage level detector. The graph shows the sensitivity in mV/dBm over output power in dBm. The power level detector can be operated on a 50 Ohm output line of a test signal circuit TSC. A voltage level detector is better to tap into a line with a higher impedance. The described implementations allow for a voltage level detector VLD to be used instead of a power level detector.

It is shown that the proposed test signal circuit TSC has significantly higher sensitivity. That means the high impedance of the voltage level detector VLD, IVLD, QVLD translates to a higher voltage swing. At each of the I and Q branch, both sidebands of the modulating signal are present which leads to higher peak voltage, of e. g. around a 3 dB, as compared to the output of power combiner PC. The voltage level detector VLD, IVLD, QVLD sees a higher input voltage as compared to the case when it is used at the output of the power combiner PC, which has an insertion loss of its own.

The invention claimed is:

1. A test signal circuit for testing a radio frequency receiver circuit, comprising:
a test signal generator configured to generate a baseband test signal;
a modulator configured to modulate a local oscillator signal with the baseband test signal to generate a test signal;
a first transmission element coupled between the modulator and an input of an impedance transforming element;
a second transmission element coupled to an output of the impedance transforming element,
wherein the impedance transforming element is configured to lower a first impedance level of the first transmission element to a second impedance level of a second transmission element; and at least one voltage level detector coupled to the first transmission element, the at least one voltage level detector being configured to detect a voltage level of the test signal.

2. The test signal circuit according to claim 1, wherein the at least one voltage level detector comprises a first voltage level detector and a second voltage level detector, and
wherein the modulator is configured to be an I-Q modulator generating the test signal in two components, a first component on an I path and a second component on a Q path, the first voltage level detector being coupled to the I path and the second voltage level detector being coupled to the Q path, the impedance transforming element comprising a power combiner combining the first component and the second component.

3. The test signal circuit according to claim 2, wherein a third voltage level detector is coupled to the second transmission element between the impedance transforming element and the radio frequency receiver circuit.

4. The test signal circuit according to claim 3, comprising an analog-to-digital converter coupled to an output of the at least one voltage level detector and/or the third voltage level detector, wherein the analog-to-digital converter is configured to convert the voltage level to a digital signal and to output the digital signal to a control circuit connected to the test signal circuit.

5. The test signal circuit according to claim 1, wherein the at least one voltage level detector is coupled to the first transmission element between the impedance transforming element and a power combiner.

6. The test signal circuit according to claim 1, wherein the first impedance level of the first transmission element is more than 2 times higher than the second impedance level of the second transmission element.

7. The test signal circuit according to claim 1, wherein the at least one voltage level detector is coupled to the first transmission element closer to the modulator than to the impedance transforming element.

8. The test signal circuit according to claim 1, wherein the test signal generator comprises a digital test signal data generator and a digital-to-analog converter to generate the baseband test signal.

9. The test signal circuit according to claim 1, wherein the test signal circuit is configured for testing at least one of:
a gain, a frequency response, an inter-channel amplitude and phase balance, or an inter-channel noise of the radio frequency receiver circuit.

10. A semiconductor chip comprising:
a test signal circuit comprising:
a test signal generator configured to generate a baseband test signal;
a modulator configured to modulate a local oscillator signal with the baseband test signal to generate a test signal;
a first transmission element coupled between the modulator and an input of an impedance transforming element;
a second transmission element coupled to an output of the impedance transforming element,
wherein the impedance transforming element is configured to lower a first impedance level of the first transmission element to a second impedance level of a second transmission element; and at least one voltage level detector coupled to the first transmission element, the at least one voltage level detector being configured to detect a voltage level of the test signal; and a radio frequency receiver circuit.

11. A system comprising:

a test signal circuit comprising:

a test signal generator configured to generate a baseband test signal;

a modulator configured to modulate a local oscillator signal with the baseband test signal to generate a test signal;

a first transmission element coupled between the modulator and an input of an impedance transforming element;

a second transmission element coupled to an output of the impedance transforming element, wherein the impedance transforming element is configured to lower a first impedance level of the first transmission element to a second impedance level of a second transmission element; and at least one voltage level detector coupled to the first transmission element, the at least one voltage level detector being configured to detect a voltage level of the test signal; and a control circuit, wherein the control circuit comprises:

a first interface being coupled to a radio frequency receiver circuit for receiving a signal indicative of the test signal being processed by the radio frequency receiver circuit;

a processor being configured to generate a control signal; and a second interface being coupled to the test signal generator for transmitting the control signal to the test signal generator.

12. The system according to claim 11, wherein the control circuit comprises a third interface being coupled to an output of an analog-to-digital converter for receiving a digital signal, and wherein the processor is configured to generate the control signal based on the digital signal.

13. The system according to claim 12, wherein the at least one voltage level detector comprises a first voltage level detector and a second voltage level detector, and wherein the test signal circuit further comprises:

a third voltage level detector is coupled to the second transmission element between the impedance transforming element and the radio frequency receiver circuit, wherein an output of the third voltage level detector is coupled to the analog-to-digital converter.

14. The system according to claim 13, wherein the processor is configured to receive the digital signal and to generate the control signal such that imperfections of the modulator are reduced.

15. The system according to claim 13, wherein the test signal circuit further comprises:

an analog-to-digital converter coupled to an output of the at least one voltage level detector and/or the third voltage level detector, wherein the analog-to-digital converter is configured to convert the voltage level to a digital signal and to output the digital signal to a control circuit connected to the test signal circuit.

16. The system according to claim 11, wherein the at least one voltage level detector comprises a first voltage level detector and a second voltage level detector, and wherein the modulator is configured to be an I-Q modulator generating the test signal in two components, a first component on an I path and a second component on a Q path, the first voltage level detector being coupled to the I path and the second voltage level detector being coupled to the Q path, the impedance transforming element comprising a power combiner combining the first component and the second component.

17. The system according to claim 11, wherein the at least one voltage level detector is coupled to the first transmission element between the impedance transforming element and a power combiner.

18. The system according to claim 11, wherein the at least one voltage level detector is coupled to the first transmission element closer to the modulator than to the impedance transforming element.

19. The system according to claim 11, wherein the test signal generator comprises a digital test signal data generator and a digital-to-analog converter to generate the baseband test signal.

20. The system according to claim 11, wherein the test signal circuit is configured for testing at least one of:

a gain, a frequency response, an inter-channel amplitude and phase balance, or an inter-channel noise of the radio frequency receiver circuit.

* * * * *